United States Patent
Daulle et al.

(10) Patent No.: US 6,767,128 B1
(45) Date of Patent: Jul. 27, 2004

(54) ELECTROMAGNETIC WAVE SENSOR

(75) Inventors: Armelle Daulle, Grenoble (FR);
Jacques Richard, Grenoble (FR);
Pascal Xavier, Corenc (FR);
Dominique Rauly, Grenoble (FR)

(73) Assignee: Centre National de la Recherche Scientifique (CNRS), Paris Cedex (FR)

( * ) Notice: Subject to any disclaimer, the term of this patent is extended or adjusted under 35 U.S.C. 154(b) by 0 days.

(21) Appl. No.: 10/111,699

(22) PCT Filed: Oct. 27, 2000

(86) PCT No.: PCT/FR00/02999
§ 371 (c)(1),
(2), (4) Date: Jun. 26, 2002

(87) PCT Pub. No.: WO01/31349
PCT Pub. Date: May 3, 2001

(30) Foreign Application Priority Data

Oct. 28, 1999 (FR) .............................. 99 13541

(51) Int. Cl.⁷ .............................. G01K 1/16; G01J 5/00
(52) U.S. Cl. .......................... 374/120; 374/32; 374/163
(58) Field of Search .......................... 374/32, 163, 120, 374/121, 132, 11, 30, 44, 122, 185, 208; 338/25, 28

(56) References Cited

U.S. PATENT DOCUMENTS

| | | | | |
|---|---|---|---|---|
| 3,781,748 A | * | 12/1973 | Bishop et al. | 338/15 |
| 3,898,605 A | * | 8/1975 | Burns | 338/18 |
| 4,211,911 A | * | 7/1980 | Dehn | 219/746 |
| 4,463,262 A | * | 7/1984 | Contreras | 250/349 |
| 4,598,163 A | * | 7/1986 | Ito | 136/213 |
| 4,789,823 A | | 12/1988 | Delfs et al. | |
| 5,054,936 A | * | 10/1991 | Fraden | 374/164 |
| 5,102,470 A | * | 4/1992 | Kodato et al. | 136/225 |
| 5,302,024 A | | 4/1994 | Blum | |

OTHER PUBLICATIONS

Patent Abstracts of Japan, vol. 015, No. 139, (E–1053), Apr. 9, 1991 & JP 03 019290 A (Sanyo Electric Co Ltd.), Jan. 28, 1991, Abstract.

* cited by examiner

Primary Examiner—Diego Gutierrez
Assistant Examiner—Mirellys Jagan
(74) Attorney, Agent, or Firm—Foley & Lardner LLP

(57) ABSTRACT

The invention concerns a sensor for direct measurement of electromagnetic power, comprising a guiding structure (2) for bringing the power, a dissipative charge (3) and a thermometer. The invention is characterized in that the charge (3) and the thermometer are formed by a single element.

8 Claims, 8 Drawing Sheets

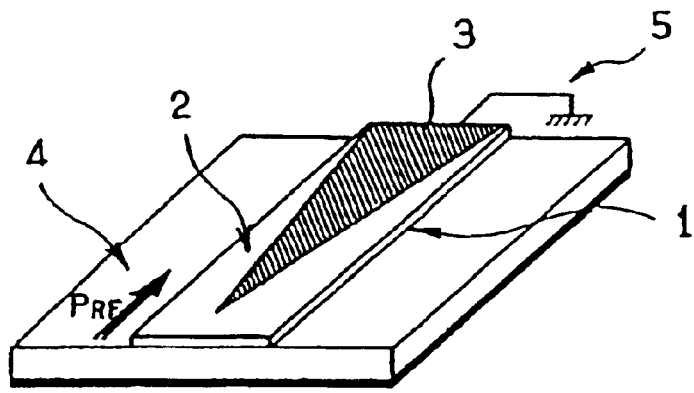
FIG_1
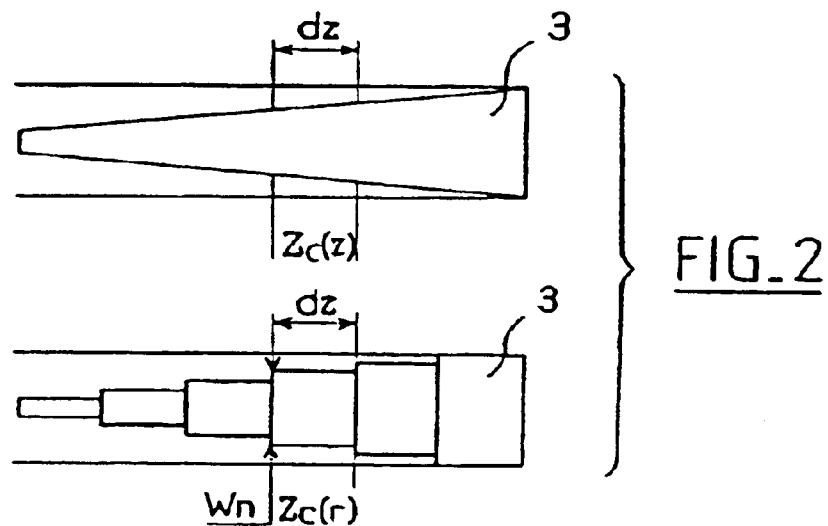
FIG_2
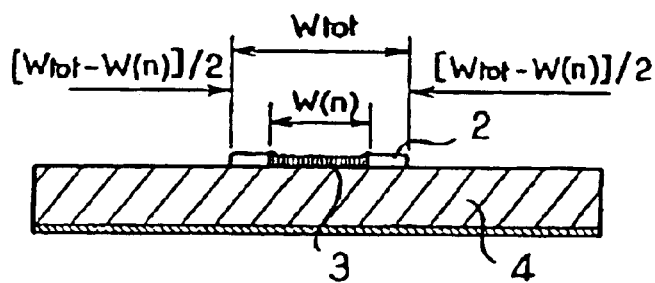
FIG_3

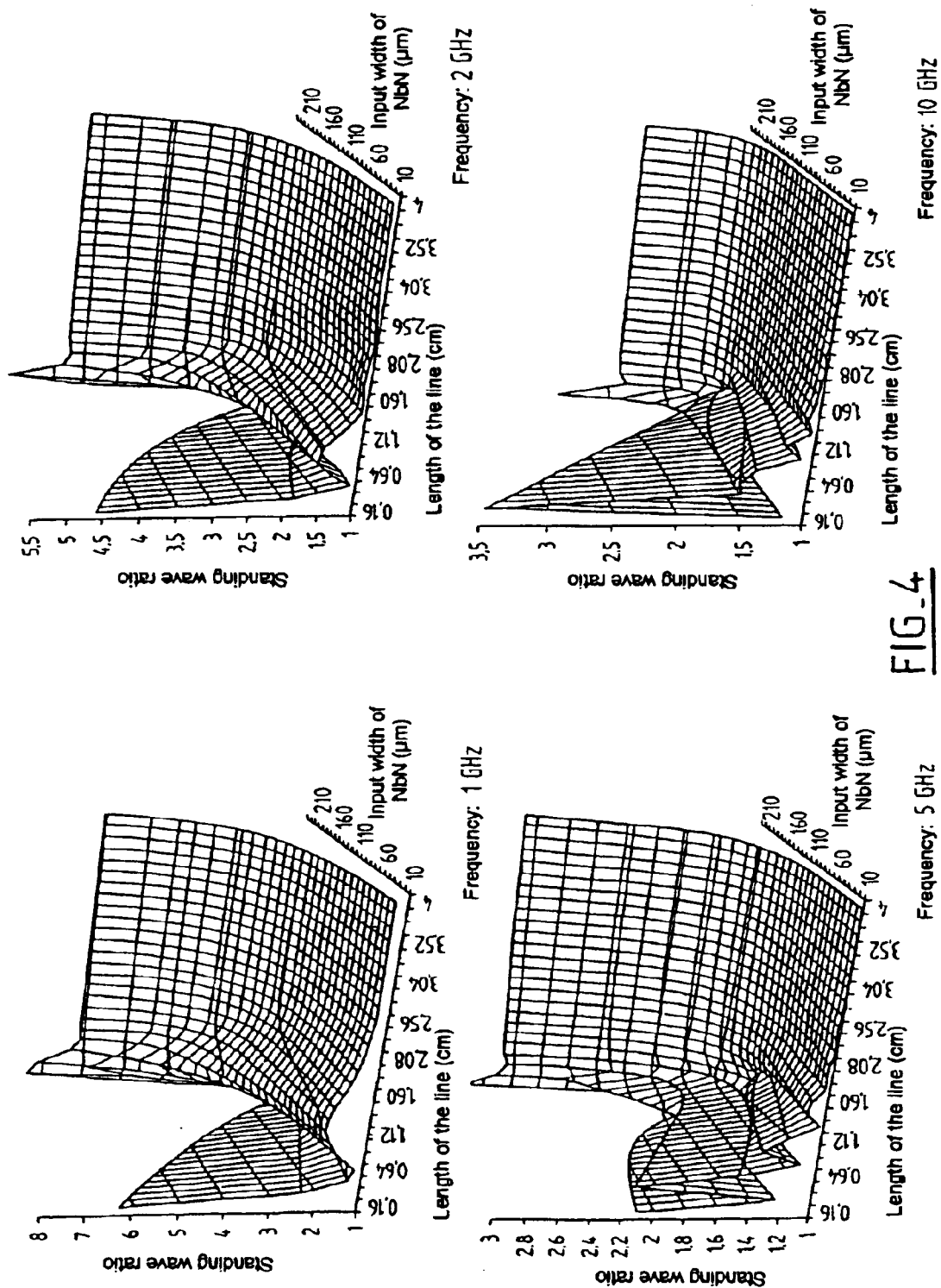
FIG_4

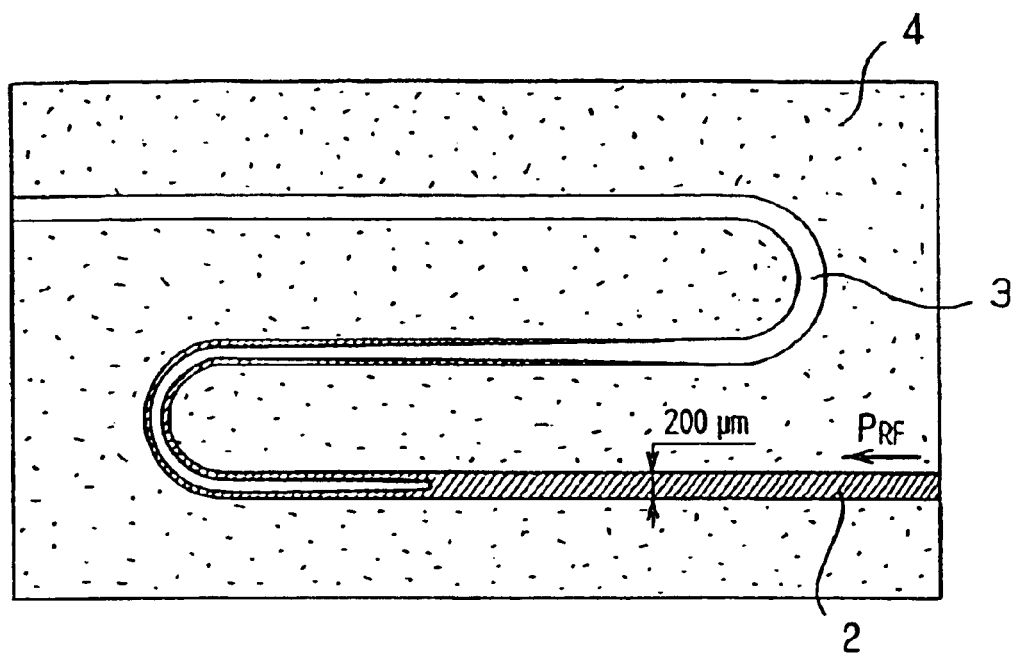
FIG_5
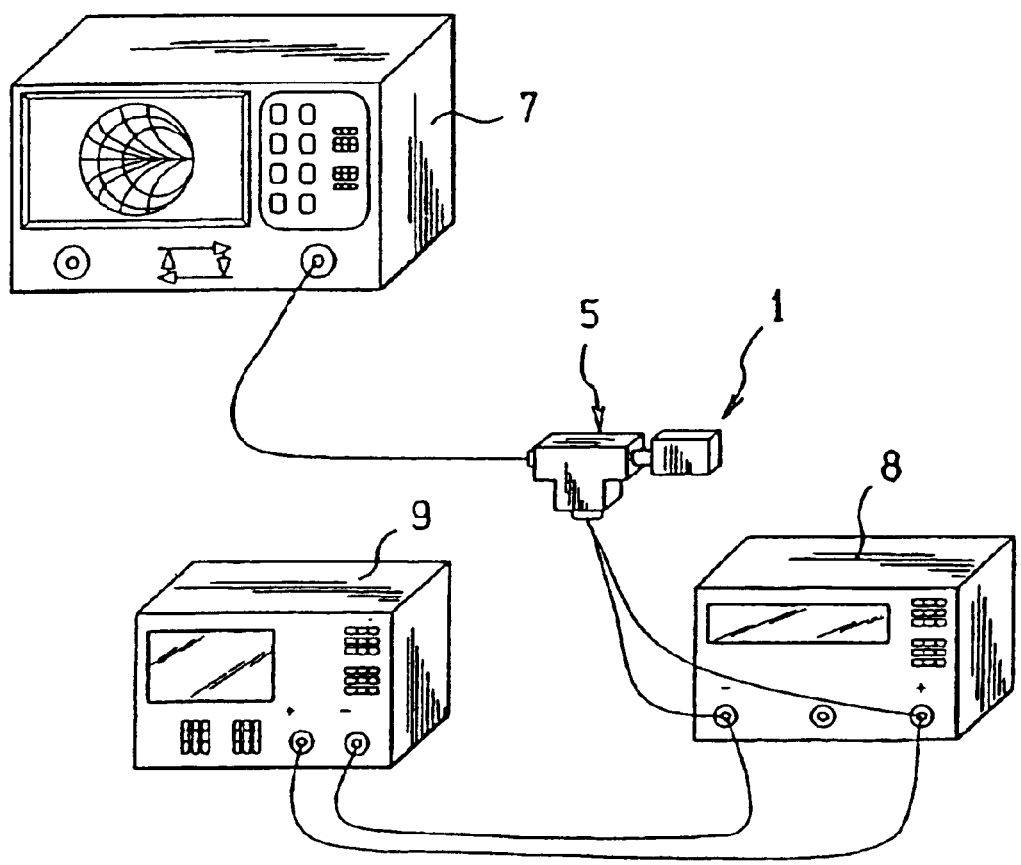
FIG_6

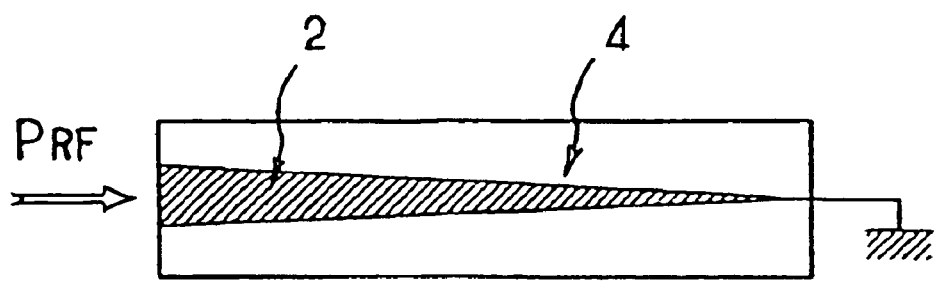
FIG_7
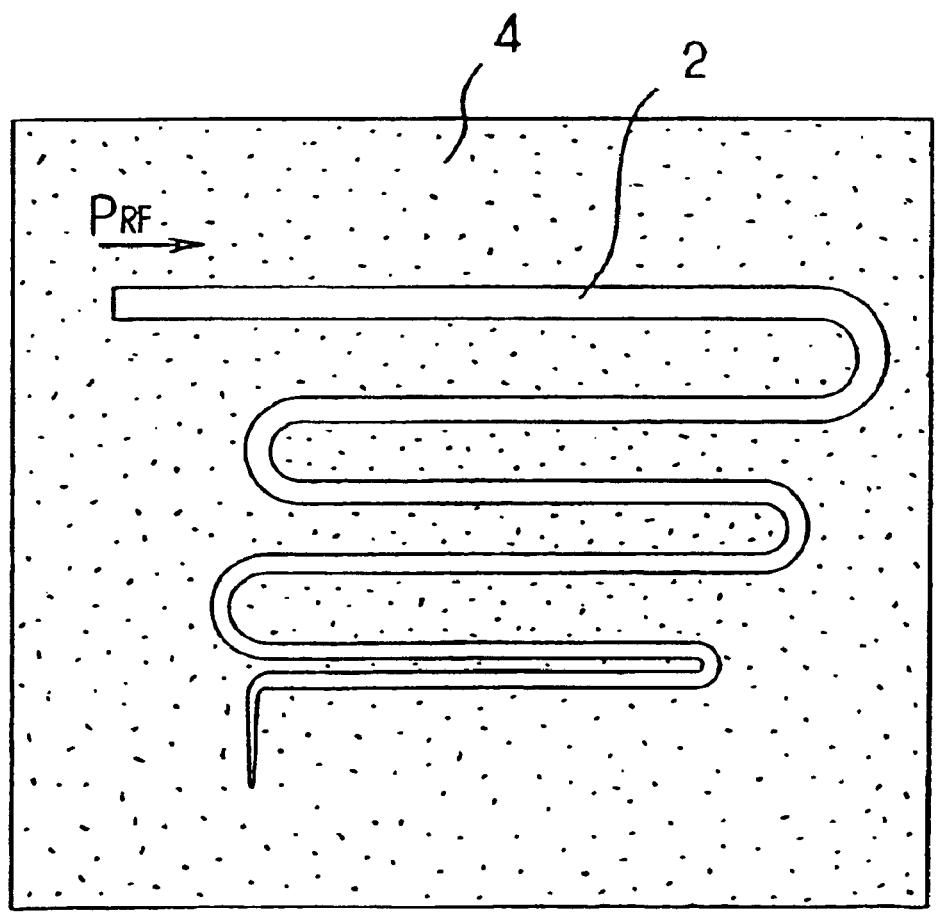
FIG_8

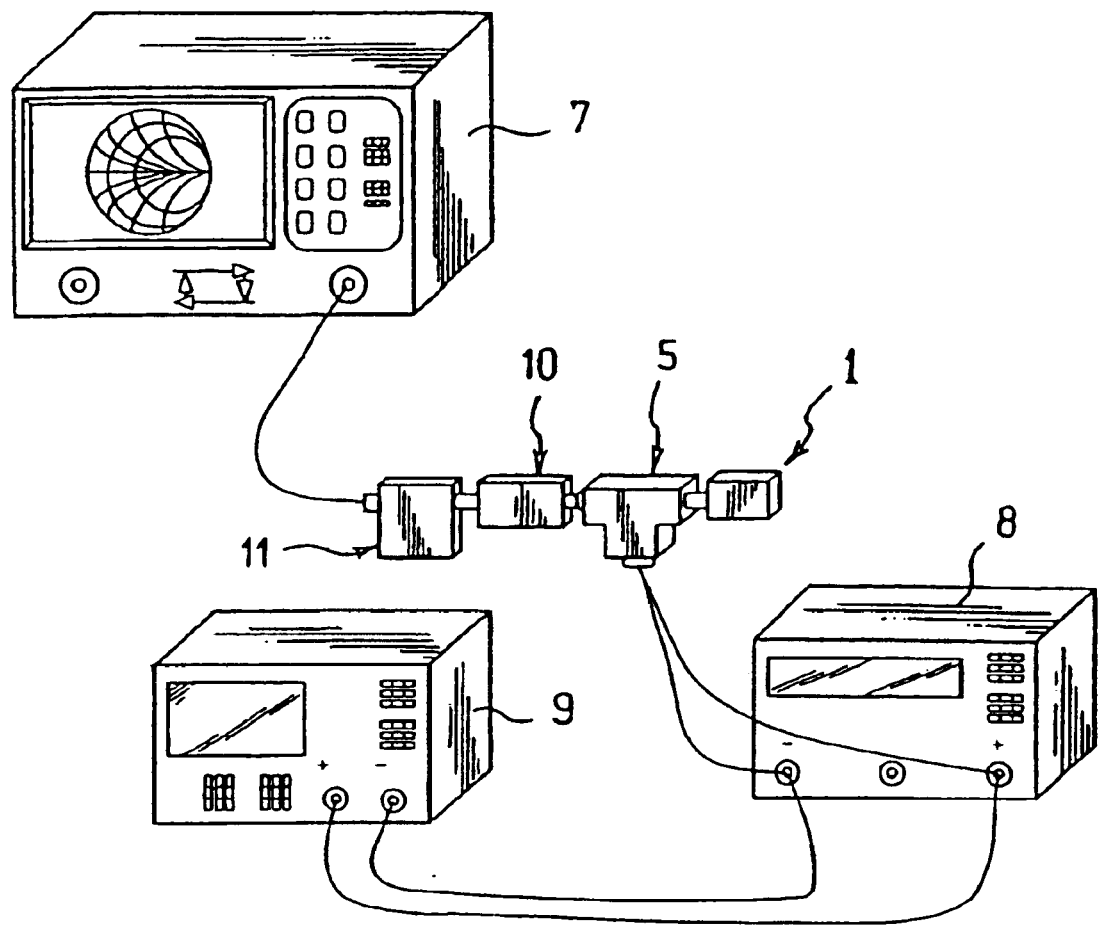
FIG_9
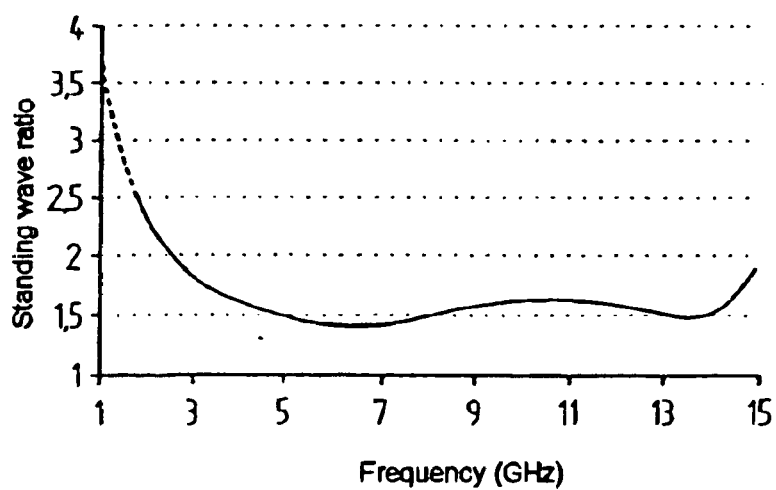
FIG_10

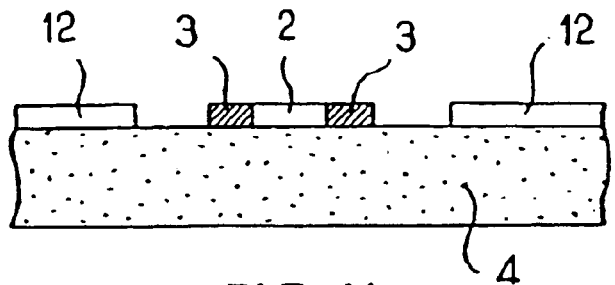
FIG_11a
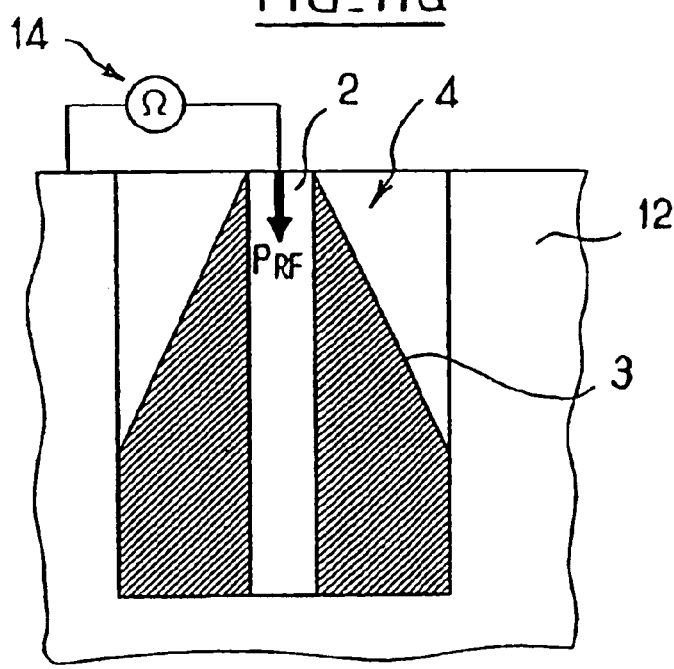
FIG_11b
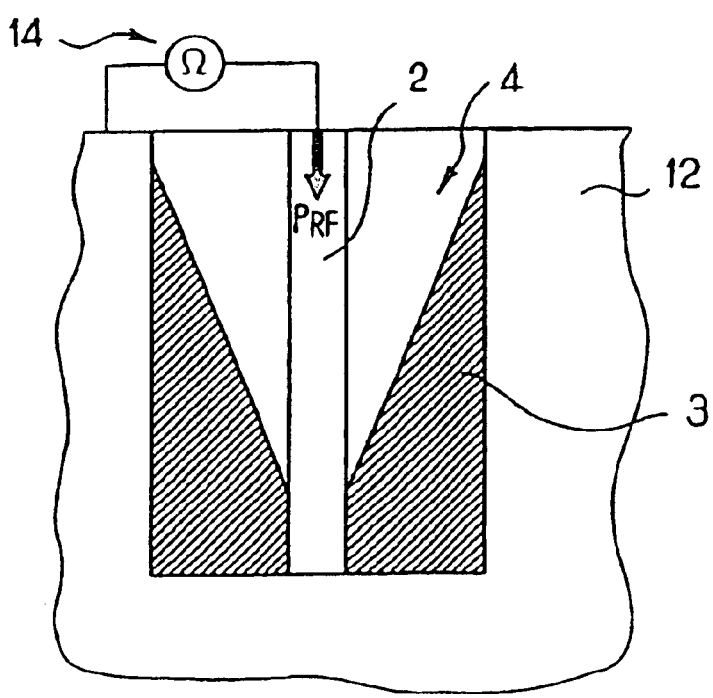
FIG_12

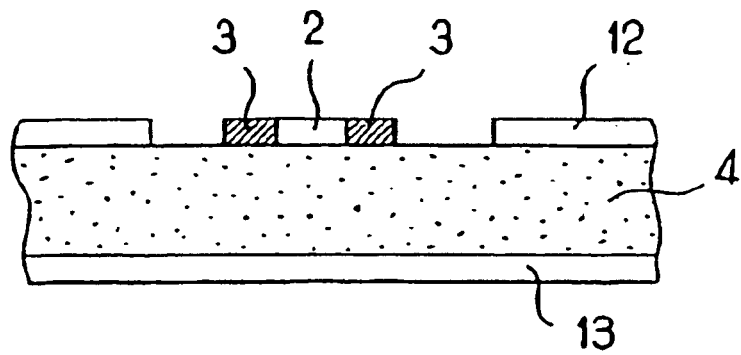
FIG_13
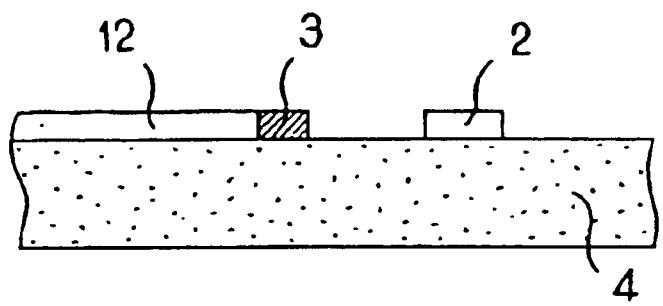
FIG_14a
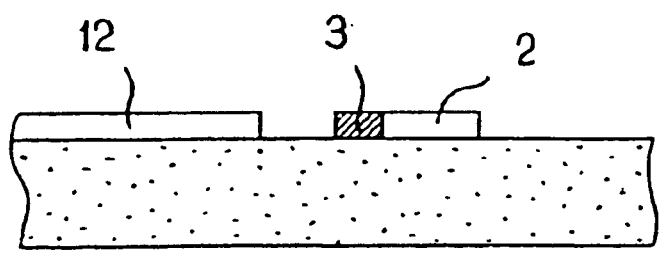
FIG_14b
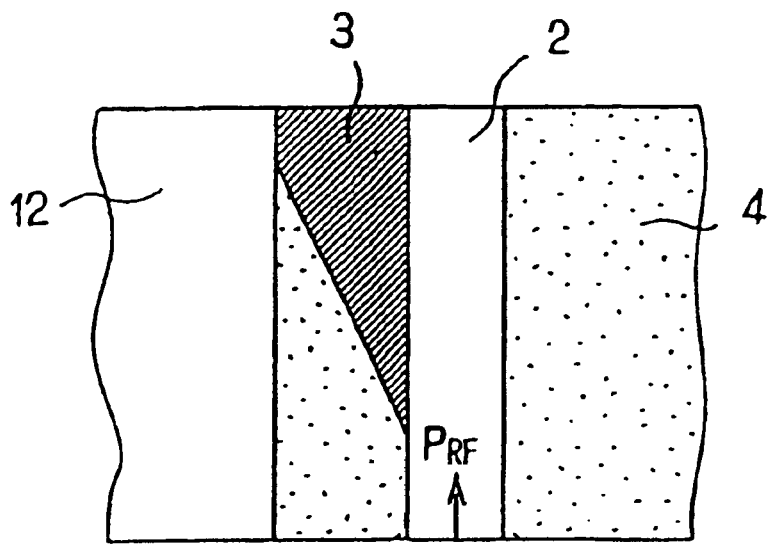
FIG_14c

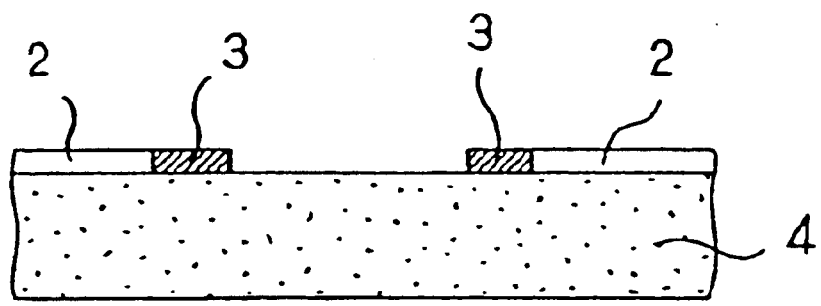
FIG_15a
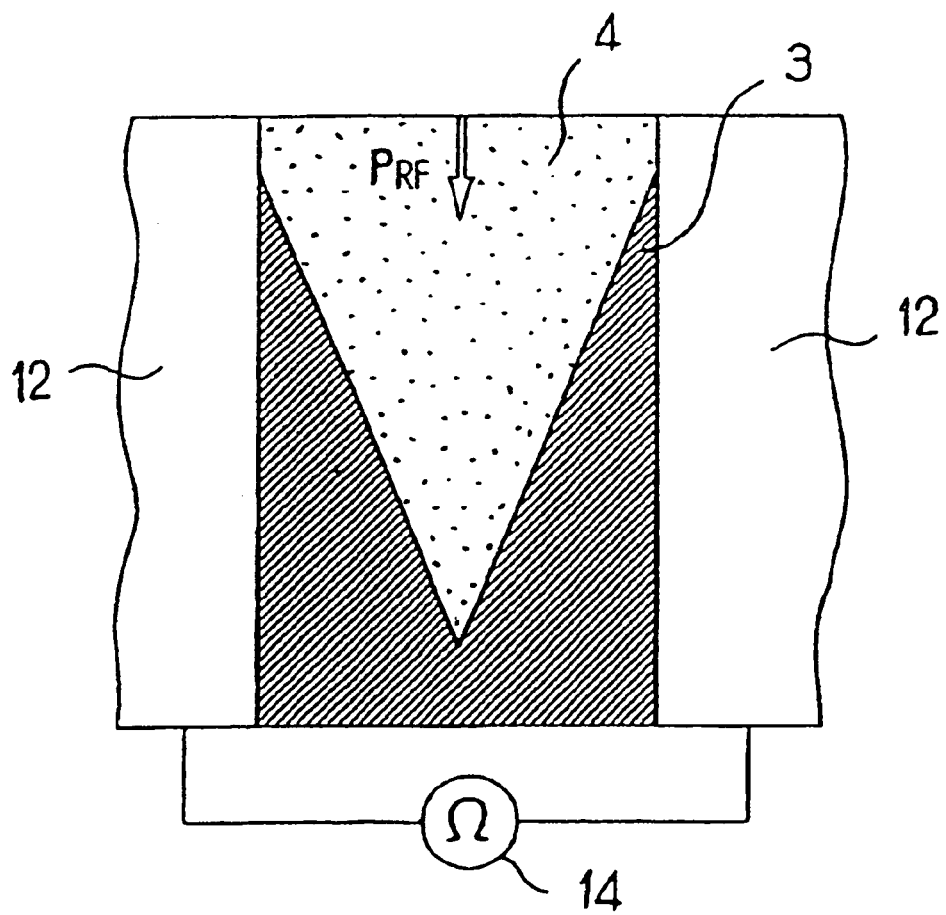
FIG_15b

ELECTROMAGNETIC WAVE SENSOR

The invention relates to the field of sensors for the direct measurement of electromagnetic power, and to their manufacture.

It is very useful in many industrial fields to measure the power of an electromagnetic wave.

To know the power levels at all stages is crucial for the performance of most microwave equipment, whether during the design phase of this equipment or during their normal use. Each component must receive a suitable power level from the upstream component and must itself deliver the correct level to the downstream component. If the power level is too low, the useful signal is drowned in noise. If the level is too high, distortion and saturation problems arise. Moreover, at microwave frequencies, the power is, for metrologists, a well-defined characteristic, unlike the voltage or the current.

The power of an electromagnetic wave is generally measured by means of isolated electromagnetic power sensors or radiofrequency (RF) and ultrahigh frequency (UHF) watt meters comprising such sensors.

Electromagnetic power sensors using thermal diodes or sensors, such as bolometers or thermocouples, for measuring the power are already known.

In diode sensors, the diode is mounted in a detection cell and the average voltage at the output of this cell is used to measure the power upstream of the diode. The advantages of such power sensors are, for example, the sensitivity (powers as low as −70 dBm, i.e. 0.1 nW, may be measured), the dynamic range (typically 50 dB), the ability to be integrated into silicon planar circuits and the speed (overall response time approximately 1 $\mu$s). However, these sensors are non-linear for power levels above −20 dBm (i.e. 10 $\mu$W). To be able to measure higher powers, an attenuator has to be placed in the measurement chain, but this reduces the accuracy of the measurement. In this case, manufacturers are obliged to provide diode sensors having a sophisticated electronic circuit comprising a microprocessor and memories, so as to correct these nonlinearities. This increases the cost of such sensors.

In thermal sensors, two types of measurement are mainly used, namely "compensated" measurement and "direct" measurement.

In the case of a compensated measurement, the load absorbs the electromagnetic power, but also that delivered by an additional DC electric current, and is maintained at a constant temperature by regulating the level of the power absorbed (any variation in the electromagnetic power is compensated for by a variation in the opposite direction of the power delivered by a DC electric current). Measuring the DC electric current gives the electromagnetic power level of the wave. However, the manufacture of this type of sensor has the drawback of being technologically complex.

In the case of a direct measurement, the electromagnetic wave is absorbed in a matched load and converted into heat (the principle of bolometry); the heat-up of the structure is then measured with a thermistor or a thermocouple. This type of sensor comprises two distinct elements: the matched load, which absorbs the power and converts it into heat, and the thermometer, which may be a thermistor or a thermocouple. The advantages of such thermal sensors are the measurement accuracy, the bandwidth and the fact that high-power measurements are possible.

One objective of the invention is to provide a sensor for the direct measurement of electromagnetic power, giving an accurate measurement, having a relatively wide bandwidth, and allowing measurements at high power, while still having a low manufacturing cost.

This objective is achieved, according to the invention, by virtue of a sensor for the direct measurement of electromagnetic power, comprising a guiding structure for injecting the power, a dissipative load and a thermometer, characterized in that a single element forms the load and the thermometer.

For this purpose, such a sensor is a thermal sensor. It therefore has the advantages of this type of sensor, while still having, by virtue of the fact that the load and the thermometer constitute a single element, a simplified technological construction and consequently a lower manufacturing cost.

Advantageously, the guiding structure is a planar structure, especially in the form of a microstrip line. The sensor can then be integrated into a structure which is itself planar.

Also advantageously, the transition between the guiding structure and the load is made with a pointed profile. This transition may be produced with a load having a pointed profile and/or a guiding structure having a pointed profile. Such a technique is also called tapering. This technique makes it possible to have, as input for the load, a characteristic impedance close to the 50 ohm nomical impedance of the line. The tapered line absorbs the incident microwave power progressively, while minimizing therefore the parasitic reflections. The power is dissipated in the form of heat, and hence the temperature of the line increases and, as a consequence, the DC resistance of the line varies (without this affecting the ultrahigh frequency behavior of the line). All that is required therefore is to measure this variation.

The term "load" used in this text corresponds to a localized load and/or a distributed load.

According to another aspect, the invention is a process for manufacturing sensors for the direct measurement of electromagnetic power, comprising the production of a guiding structure for injecting the power, of a dissipative load and of a thermometer, characterized in that the load and the thermometer are produced in the form of a single resistive element.

Advantageously then, according to this process, the transition between the guiding structure and the load is made with a pointed profile.

According to another aspect, the invention is a device comprising a sensor such as that presented above.

Advantageously then, the latter comprises two elements, of which:
  one is a sensor for the direct measurement of electromagnetic power, which comprises a guiding structure for injecting the power, a dissipative load and a thermometer, the latter two components forming a single element; and
  the other serves for regulating the temperature of the sensor for the direct measurement of electromagnetic power.

This makes it possible to compensate the variations in room temperature. According to one version, the device serving for regulating the temperature perhaps a Peltier-effect device. According to another version of the device according to the invention, this comprises two elements identical to said sensor, but only one of them is exposed to the electromagnetic wave whose power it is desired to measure.

A differential measurement is then made, in which both sensors are placed in a Wheatstone bridge, and one of them is exposed to the electromagnetic wave while the other is not. This guarantees reproducible measurement of the power whatever the temperature drift of the sensor.

Other aspects, objectives and advantages of the invention will become more clearly apparent on reading the detailed description which follows. A better understanding of the invention will also be gained from the appended drawings in which:

FIG. 1 shows schematically, in perspective, a first embodiment of a sensor according to the invention;

FIG. 2 shows schematically, seen from above, the tapered load of a sensor of the type shown in FIG. 1 and a model, in segments, of this load;

FIG. 3 shows schematically, in cross section, a sensor of the type shown in FIGS. 1 and 2;

FIG. 4 corresponds to four curves representing the standing wave ratio obtained by numerical simulation of a sensor of the type shown in FIGS. 1, 2 and 3, as a function of its dimensions;

FIG. 5 shows schematically, seen from above, the microstrip line of a sensor of the type shown in FIGS. 1, 2 and 3;

FIG. 6 shows schematically a measurement device comprising a sensor of the type shown in FIGS. 1, 2, 3 and 4;

FIG. 7 shows schematically, seen from above, a second embodiment of a sensor according to the invention;

FIG. 8 shows schematically, seen from above, an alternative form of the sensor shown in FIG. 7;

FIG. 9 is a representation of the standing wave ratio measured on a sensor of the type shown in FIGS. 7 and 8;

FIG. 10 shows schematically a measurement device comprising a sensor of the type shown in FIGS. 7 and 8;

FIGS. 11a and 11b show an alternative form of the sensor according to the invention, corresponding to an embodiment called CPW; FIG. 11a corresponds to a cross section of this sensor; FIG. 11b corresponds to a top view of the sensor corresponding to FIG. 11a;

FIG. 12 shows, seen from above, an alternative form of the sensor according to the invention, corresponding to a structure similar to that shown in FIGS. 11a and 11b, in which the tapering has been reversed transversely;

FIG. 13 shows, in cross section, an alternative form of the sensor according to the invention, corresponding to a structure of the type of those shown in FIGS. 11 and 12, to which a ground plane has been added on the rear face of the substrate;

FIGS. 14a, 14b and 14c represent an alternative form of the sensor according to the invention, corresponding to an embodiment of the asymmetric coplanar line type; FIGS. 14a and 14b correspond to a cross section of two distinct embodiments of sensors corresponding to this type of structure; FIG. 14c corresponds to a top view of the sensor corresponding to the embodiment illustrated in FIG. 14b; and FIGS. 15a and 15b show an alternative form of the sensor according to the invention, corresponding to an embodiment of the slot type; FIG. 15a corresponds to a cross section; FIG. 15b corresponds to a top view of the sensor illustrated in FIG. 15a.

In the sensor according to the invention, the reflected wave must not only be minimized but also must be absorbed by the material over its return path. It must be a lossy line. Furthermore, the reflection coefficient must be both temperature stable and frequency stable, so that all the power injected into the sensor is effectively absorbed, and is so over a wide band. The sensor according to the invention is designed to satisfy these conditions.

The geometry of the sensor is determined by the input impedance of the device at a given frequency, the reflection coefficient and the standing wave ratio.

Two embodiments of the sensor according to the invention will now be described in detail below.

According to the first embodiment, the sensor according to the invention is a tapered-load sensor made of niobium nitride (NbN).

This first embodiment is shown in FIG. 1. According to this embodiment, the sensor 1 comprises a platinum microstrip line 2 and an NbN tapered load 3 deposited on a magnesium oxide (MgO) substrate 4 having a thickness of 250 $\mu$m (properties of magnesium oxide: dielectric permitivity $\in$=9.6, loss factor tan$\delta$=10$^{-4}$, thermal conductivity $k_{th}\approx$20 W.m$^{-1}$.K$^{-1}$). The platinum line 2 is progressively superceded at its center by a pointed profiled NbN layer. The transition between the guiding structure and the load is therefore in this case produced with a load 3 having a pointed profile. At the end of the line, a short circuit 5 is used to connect the load 3 to the electrical ground.

The electromagnetic power $P_{RF}$ is injected at the opposite end of the tapered load 3 from the short circuit 5.

NbN is very sensitive to temperature, this having the advantage that very little power is sufficient to cause a measurable variation in resistance.

The tapered line can be modeled as being a series combination of n segments of lines of length dz and of width $W_n$ (FIG. 2).

FIG. 3 is a cross sectional diagram of a line segment of the tapered sensor corresponding to this first embodiment. This segment has a total width $W_{tot}$. The NbN width in this segment is $W_{(n)}$.

Each segment is considered from the resistivity standpoint as the parallel combination of a resistive NbN segment and two platinum segments. However, the ratio of the resistivities of these two materials means that the equivalent resistance is essentially due to the contribution of the platinum.

The total width $W_{tot}$ may be determined by simulation using the SuperCompact™ software. This is the width of the microstrip line 2, at the point of access to the sensor 1, consisting of platinum alone. It must be such that the characteristic impedance of this access point is 50 ohms. Such a simulation indicates that the total width $W_{tot}$ must be equal to 250 $\mu$m.

For the segment n of length dz, having a characteristic impedance $Z_c(n)$ and a propagation constant $\gamma(n)$ and being loaded with an impedance $Z_T(n)$, the input impedance is written:

$$Z_i(n) = Z_c(n) \cdot \frac{Z_T(n) + Z_c(n) \cdot \tan[\gamma(n)dz]}{Z_c(n) + Z_T(n) \cdot \tan[\gamma(n)dz]}$$

All the parameters involved in this expression are calculated at each new iteration n as a function of the width W(n).

The quadripole n=1 is the last NbN segment; it is loaded by a short circuit 5. Consequently, $Z_i(1)=Z_c(1)\cdot\tan[\gamma(1)dz]$.

Thereafter, the quadripole n=2 has, for a load impedance of $Z_T(2)$, the input impedance $Z_i(1)$ of the quadripole n=1, hence:

$$Z_i(2) = Z_c(2) \cdot \frac{Z_i(1) + Z_c(2) \cdot \tan[\gamma(2)dz]}{Z_c(2) + Z_i(1) \cdot \tan[\gamma(2)dz]}$$

And so on, step by step, for the entire length of the sensor 1.

In this way, it is therefore possible to calculate the standing wave ratio according to the geometry of the sensor 1 (length of the sensor 1:l and width of the first NbN segment: $W_{min}$).

FIG. 4 shows curves of the input standing wave ratio of the sensor 1, obtained at various frequencies within the 1–10 GHz range and with the parameters:

resistivity of NbN=10 mΩ.cm
resistivity of platinum=10 μΩ.cm
metalization thickness=1000 Å.

These curves show that the stability of the standing wave ratio is close to a value of 1 when the taper length is greater than about 2 cm. A standing wave ratio of less than 1.1 is commonly accepted, even if in industry standing wave ratios of 1.5 are frequent.

This leads to the following parameters being chosen for the geometry of the sensor 1: taper length l=23 mm (23 segments) and width of the first segment $W_{min}$=10 μm.

The line is formed by depositing a 1000 Å layer of platinum, by sputtering at 300° C., and then by producing a pattern by UV photolithography followed by ion etching. This pattern is in the form of a meander (FIG. 5). It is defined by a first mask. Its complement, defined by a second mask, serves for producing the NbN load 3.

The meander pattern allows the overall size to be reduced, while increasing the sensitivity, by maximizing the concentration of the heating.

The load 3 is produced by "lift-off" (the "lift-off" technique is a procedure for producing patterns of material as thin layers, which consists in depositing the thin layer on a substrate which already bears a resin defining a pattern and then in removing the resin by dissolving it in a solvent, only the areas which did not have resin then remain). The load is 1200 Å in thickness and covers the platinum pattern over 10 μm, along the edges of the latter, so as to ensure electrical contact.

The substrate 4 is plated with gold on the rear face in order to form the ground plane.

The sensor 1 according to this first embodiment was characterized in reflection using a Hewlett Packard™ 8720B vector network analyzer, after OSL calibration (OSL stands for Open Short Load, which means "open circuit/short circuit/matched load" and which corresponds to a standard three-point calibration procedure) between 160 MHz and 12 GHz. In this way it may be found that the standing wave ratio is constant over a wide frequency band.

The sensor 1 according to this first embodiment was also characterized in reflection. For this purpose, a DC current was injected into the sensor 1 via a Rhode & Schwartz™ polarization tee 6, whereas the reflection was measured, with a low RF power, so as not to cause any further heating. This demonstrated that the injection of a high current, heating the sensor 1, makes the resistance drop while leaving the curve giving the variations in the reflection coefficient as a function of frequency unchanged.

Provision may therefore be made for such a sensor 1 to retain a constant reflection coefficient, when the dissipation of the injected electromagnetic power causes a temperature variation.

An electromagnetic power measurement was carried out using the sensor 1 obtained according to this first embodiment.

FIG. 6 shows the experimental setup used for this measurement. This experimental setup comprises an ultrahigh-frequency source corresponding to the synthetic source of a Hewlett Packard™ 8753C vector network analyzer 7. The electromagnetic power measurement is carried out by determining the variation in the resistance $R_{sc}$, of the sensor 1, by injecting a low DC current from a Time™ 609 DC current source 8. The variation in resistance causes a variation in voltage read off a Hewlettt Packard™ 34401 digital voltmeter 9.

The sensor 1, injected with 20 dBm (100 mwatts) of RF power at a frequency of 3.5 GHz, gives a resistance variation of 100 Ω. The sensitivity of this sensor 1 therefore corresponds to 1 kΩ.W$^{-1}$, i.e, in relative quantities, $\Delta R_{sc}/R_{sc}$= 4.2% W$^{-1}$.

According to the second embodiment of the sensor according to the invention, this is a tapered platinum strip sensor.

For temperatures above 100 K, the resistivity of platinum varies linearly with temperature and the coefficient of variation of resistivity, $$\alpha = \frac{1}{R}\frac{dR}{dT},$$

is approximately equal to 0.4% K$^{-1}$.

According to this second embodiment, the sensor 1 comprises a microstrip line 2 made of a thin layer of platinum, tapered as shown schematically in FIG. 7 and deposited on a lanthanum aluminate (LaAlO$_3$) substrate having a thickness of 500 μm and an area of 5×5 mm$^2$ (the thermal conduction of LaAlO$_3$ is $k_{th}$=12 W.m$^{-1}$.K$^{-1}$).

At the end of the line, a short circuit 5 allows the strip 2 to be connected to the electrical ground.

Compared with MgO, LaAlO$_3$ has a higher dielectric permitivity ($\in_r$=24.2 at 300 K), which makes it possible to produce the phase velocity in the structure and consequently also to reduce the guided wave length.

The dimensions of the line, needed to have a characteristic impedance of 50 Ω, was evaluated by simulation using the SuperCompact™ software, considering the tapered strip as a succession of several resistive microstrip lines of various widths, terminating in a grounded short circuit 5. According to this simulation, this width must be equal to 170 μm.

The metalization thickness is 800 Å.

The tapering is made over a length of 23 mm, the width varying from 170 μm at the start of the line to 20 μm at the end of the line, and possesses a meander profile (FIG. 8) confined within a small area (about 5×4 mm$^2$).

With this geometry, the coupling between two adjacent line segments remains low.

According to this embodiment, the line 2 is formed by depositing an 800 Å platinum layer on the substrate 4 by sputtering at 200° C.

Ion etching then allows only the tapered meander to be retained.

The sensor 1 produced according to this second embodiment was characterized in reflection using a Hewlett-Packard™ 8720B vector network analyzer, after OSL calibration, between 160 MHz and 20 GHz. It may then be shown that the standing wave ratio is less then 2 over the 2.5 GHz–15 GHz range. This sensor 1 is therefore well matched over a wide band (FIG. 9).

Extraction of the connector parameters, achieved by means of the SuperCompact™ software, showed that the standing wave ratio could be less than 1.5 over the 4.5 GHz–12 GHz range. 1.5 is a typical value of standing wave ratios of industrial wattmeters.

Below 2.5 GHz, the use of this type of sensor 1 for power measurement is not possible since its standing wave ratio becomes too high, this is, of course, inherent in the very principle of tapering.

The standing wave ratio of the sensor 1 was measured on a vector network analyzer at room temperature and at a temperature of 40° C. Over the 4–8 GHz frequency band, the standing wave ratio remains insensitive to temperature variations. Between 8 and 12 GHz, the standing wave ratio curves as a function of frequency are slightly different. Above 12 GHz, this difference becomes greater. However, this behavior may stem from factors other than those directly associated with the sensor 1.

An electromagnetic power measurement was carried out using the sensor 1 obtained according to the second embodiment described above.

FIG. 10 shows the experimental setup used for this measurement. It comprises:

- an analyzer 7 (Hewlett Packard™ 8720B);
- an ultrahigh-frequency amplifier 10 (Elexience™ CNA02082840; frequency range: 2–8 GHz; gain: 28 dB min; 1 dB compression point: 18 dB min; standing wave ratio: 2);
- an isolator 11 sold by MTC™ (isolation: 18 dB; insertion loss: 0.5 dB; SWR (SWR means Standing Wave Ratio): 1.35; supported average power: 25 watts);
- a Time™ 609 DC current source 8 and
- a Prema™5017 digital voltmeter 9.

The analyzer 7 delivers −10 dBm of ultrahigh-frequency power. This is then analyzed by the ultrahigh-frequency amplifier 10.

The isolator 11 protects the analyzer from a high-power return. An MTC™ isolator of the F105 type was used for the measurements in the 2–4 GHz range. An MTC™ isolator of the H105 type was used for the measurements in the 4–8 GHz range.

The sensor 1 is mounted in a copper specimen holder. The electromagnetic wave is injected via a coaxial cable. The connection between the sensor 1 and the coaxial cable is provided by an SMA connector. The support for the substrate 4 is provided, in the ground plane of the sensor 1, with a hole 4 mm in diameter drilled in the copper so as to reduce heat exchange and thus increase the heating of the tapered line 2 if the latter absorbs microwave power. It should be noted that this tactical choice degrades the response time of the sensor 1; this matters little if it is not desired to construct a high-speed sensor, rather a sensor which measures the power of a wave in the steady state.

The sensor 1 was subjected to a gradation of power from −30 dBm to +20 dBm and its DC resistance variation was measured using the digital voltmeter 9 by injecting a small current of 100 $\mu$A from the DC current source 8. These measurements were carried out at a frequency of 6.7 GHz, at which the standing wave ratio is a minimum with a value of 1.4.

Before the measurement system is subjected to a gradation of ultrahigh-frequency power, it is left to reach a stable temperature. This is because, in operation, the amplifier 10 heats up and reaches a temperature of 54° C., whatever the input microwave power.

The power measurement is given by the value of the resistance when the sensor has reached its steady state; the sensitivity of the sensor was evaluated here at 10 $\Omega$, for 100 mW, i.e. 100 $\Omega.W^{-1}$.

The sensor 1 produced according to the second embodiment described above therefore allows the power of an electromagnetic wave guided in a planar structure to be measured with a sensitivity of 100 $\Omega.W^{-1}$ and in a typical frequency range from 2 to 12 GHz.

Two embodiments of the sensor according to the invention were described in detail above, but many other embodiments according to the invention exist. Several of them are briefly described below in relation to FIGS. 11 to 15.

FIGS. 11a and 11b show a sensor corresponding to a CPW (Coplanar Wave-Guide embodiment which corresponds to a type of structure well known a person skilled in the art). The sensor 1 comprises a line 2, a tapered load 3 and a metal ground layer 12. The electromagnetic power is then measured by a device 14 measuring the resistance with a DC current. The resistance being measured between line 2 and the metal ground layer 12. FIG. 11a corresponds to a cross section of the sensor 1 corresponding to this embodiment. FIG. 11b corresponds to a top view of the sensor 1 corresponding to FIG. 11a.

FIG. 12 corresponds to a structure similar to that shown in FIGS. 11a and 11b, in which the tapering has been reversed transversely.

FIG. 13 corresponds to a structure of the type shown in FIGS. 11 and 12, to which a ground plane 13 has been added to the rear face of the substrate 4. This type of structure corresponds to a GCPW (Grounded Coplanar Waveguide) embodiment.

FIGS. 14a, 14b and 14c correspond to an embodiment of the asymmetrical coplanar line type. FIGS. 14a and 14b correspond to a cross section of the sensor 1 corresponding to two distinct embodiments of sensors 1 according to this type of structure. FIG. 14c corresponds to a top view of the sensor 1 corresponding to the embodiment of the sensor 1 shown in FIG. 14b. It is also possible to design, in the likeness of the structure shown in FIG. 13, sensors 1 such as those in FIGS. 14a, 14b and 14c, with a ground plane 13 at the rear of the substrate 4.

FIGS. 15a and 15b correspond to an embodiment of the slot type. FIG. 15a corresponds to a cross section of the sensor 1 corresponding to this embodiment. FIG. 15b corresponds to a top view of the sensor 1 corresponding to FIG. 15a. The load 3 is tapered. The electromagnetic wave is guided in the slot by the substrate 4 and progressively attenuated in the load 3, which runs along the lateral ground planes 12. The resistance is measured between the two lateral ground planes 12. It is also possible to design, in the likeness of the structure shown in FIG. 13, sensors 1 such as that in FIGS. 15a and 15b, with a ground plane 13 at the rear of the substrate 4.

In general a sensor 1 according to the invention may be made in the form of any such planar-type structure, in particular allowing partial filling with a dissipative material, so as to create a tapered distributed load, with a salient or reentrant tip, accessible by a DC measurement. It is also possible to envisage tapering the guiding structure itself, that is to say the metalizations. This sensor 1, of low cost as it is technologically simpler than the sensors currently existing on the market, employs only a single metal element deposited on a dielectric substrate 4 of relatively high permitivity. It can be integrated into most ultrahigh-frequency circuits and benefits from a standing wave ratio which is very competitive with conventional industrial sensors.

To improve the performance of this type of sensor 1, the temperature of the sensor support (made of copper) may be regulated by a miniature Peltier-effect system.

The variations in room temperature may also be compensated for by producing two identical sensors on the same substrate. With both placed in a Wheatstone bridge, one is exposed to the electromagnetic wave and the other not, according to the differential sensor principle. The intrinsic linearity of the thermal sensitivity of platinum then guarantees a reproducible power measurement whatever the temperature drift of the sensor 1.

The invention therefore makes it possible to measure the true RMS value of the power of a guided electromagnetic wave in a planar circuit within a power range typically from 1 mW to 1 W (or higher if a power coupler is added to the sensor) and within a typical frequency range from 2 GHz to 15 GHz. Depending on the case, this measurement is carried out in order to:

check that the output power level of a component or of a system is correct and meets a specification or a standard (in design, in production and in on-site or remote maintenance); and measure a power level for the purpose of calibrating ultrahigh-frequency systems.

The fields of application are numerous as ultrahigh-frequency systems are very widespread and correspond to fields of application of ultrahigh-frequency industrial wattmeters:

in telecommunications and in telebroadcasting (for example for the in situ checking of the output level of a local oscillator, of a source or in a phase-locked loop);

in ultrahigh-frequency scientific instrumentation;

in military radar instrumentation, on board or not; and the agri-foodstuffs industry (drying, baking and freezing) or in the manufacture of raw materials (paper pulp, rubber, etc.) with the addition of a power coupler.

The invention has the following advantages:

a—low cost, as technologically simpler than sensors currently existing on the market;

b—versatility with respect to the substrate technology employed in the ultrahigh-frequency system in which the sensor is placed (however, it is more specifically dedicated to systems having a dielectric constant high enough for a sensor to be kept to reasonable dimensions);

c—integratability;

d—intrinsic linearity (which is not the case with existing sensors);

e—zero sensitivity to variations in room temperature;

f—bandwidth;

g—low SWR; and h—direct measurement of the true RMS power value (like any thermal sensor).

What is claimed is:

1. A sensor for the direct measurement of electromagnetic power, comprising:

a guiding structure into which the electromagnetic power is injected;

a dissipative load directly coupled to the guiding structure and positioned to receive the electromagnetic power from the guiding structure; and a thermometer formed with the load as a single element and configured to measure a current temperature of the load, wherein a transition between the guiding structure and the load is made with the load having a pointed profile, and with the guiding structure having a reverse pointed profile receiving the pointed profile of the load, and wherein the current temperature of the load is directly correlated to a current amount of electromagnetic power received by the load.

2. The sensor as claimed in claim 1, wherein the guiding structure is a planar line.

3. The sensor as claimed in claim 1, further comprising a substrate on which the load, the guiding structure and the thermometer are formed, wherein the load is formed of niobium nitride (NbN), and wherein the substrate is formed of magnesium oxide (MgO).

4. The sensor as claimed in claim 1, further comprising a substrate on which the load, the guiding structure and the thermometer are formed, wherein the load is formed of niobium nitride (NbN), and wherein the substrate is formed of lanthanum aluminate ($LaAlO_3$).

5. The sensor as claimed in claim 1, wherein the pointed profile narrows to a single point to thereby form a triangular region in the guiding structure.

6. A device for measuring electromagnetic power, comprising:

a sensor for the direct measurement of electromagnetic power, the sensor comprising a guiding structure for receiving the electromagnetic power that is injected into the device, a dissipative load that is directly coupled to the guiding structure, and a thermometer that is formed with the load as a single element and that is configured to measure a current temperature of the load, wherein the single element has a first pointed profile received in a second pointed profile of the guiding structure, and wherein the current temperature of the load is correlated to a current amount of electromagnetic power received by the load.

7. The device as claimed in claim 6, wherein the first pointed profile narrows to a single point to thereby form a first triangle, and wherein the second pointed profile narrows to a single point to thereby form a second triangle having a same shape as the first triangle.

8. A process for manufacturing a sensor for the direct measurement of electromagnetic power, comprising:

forming a substrate;

forming a guiding structure for receiving the electromagnetic power that is injected into the sensor, the guiding structure being formed on a top surface of the substrate, the guiding structure having a first pointed profile; and forming a single element corresponding to a dissipative load and a thermometer on a same plane as the guiding structure on the top surface of the substrate, the single element having a second pointed profile received in the first pointed profile, the single element being directly coupled to of the guiding structure, wherein the thermometer is configured to measure a current temperature of the load so as to determine a current amount of electromagnetic power received by the load.

* * * * *